United States Patent
Nakamura et al.

(10) Patent No.: US 7,745,880 B2
(45) Date of Patent: Jun. 29, 2010

(54) DIELECTRIC SUBSTRATE WITH REFLECTING FILMS

(75) Inventors: Toshiyuki Nakamura, Tokyo (JP); Satoshi Machida, Tokyo (JP); Sachiko Yabe, Tokyo (JP); Takashi Taguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 868 days.

(21) Appl. No.: 11/252,632

(22) Filed: Oct. 19, 2005

(65) Prior Publication Data

US 2006/0102975 A1  May 18, 2006

(30) Foreign Application Priority Data

Nov. 18, 2004  (JP) ............... 2004-334914

(51) Int. Cl.
*H01L 31/0232* (2006.01)

(52) U.S. Cl. .............. 257/352; 257/E31.127

(58) Field of Classification Search ......... 257/347–354, 257/E31.119, E31.127
See application file for complete search history.

(56) References Cited

U.S. PATENT DOCUMENTS

| | | | | | |
|---|---|---|---|---|---|
| 4,093,957 | A | * | 6/1978 | King et al. | 257/227 |
| 4,297,719 | A | * | 10/1981 | Hsu | 257/316 |
| 5,877,094 | A | | 3/1999 | Egley et al. | |
| 6,861,281 | B2 | * | 3/2005 | Uemura et al. | 438/93 |
| 2002/0081773 | A1 | * | 6/2002 | Inoue et al. | 438/108 |
| 2004/0108511 | A1 | * | 6/2004 | Baik et al. | 257/98 |
| 2005/0205884 | A1 | * | 9/2005 | Kim et al. | 257/98 |

FOREIGN PATENT DOCUMENTS

| | | |
|---|---|---|
| JP | 07-283383 | 10/1995 |
| JP | 11-220114 | 8/1999 |

* cited by examiner

*Primary Examiner*—Allan R. Wilson
(74) *Attorney, Agent, or Firm*—Volentine & Whitt, P.L.L.C.

(57) ABSTRACT

A semiconductor device has a transparent dielectric substrate such as a sapphire substrate. To enable fabrication equipment to detect the presence of the substrate optically, the back surface of the substrate is coated with a triple-layer light-reflecting film, preferably a film in which a silicon oxide or silicon nitride layer is sandwiched between polycrystalline silicon layers. This structure provides high reflectance with a combined film thickness of less than half a micrometer.

12 Claims, 5 Drawing Sheets

DIELECTRIC SUBSTRATE WITH REFLECTING FILMS

BACKGROUND OF THE INVENTION

1. Field of the Invention

The present invention relates to a process for forming a semiconductor device on a transparent dielectric substrate such as a sapphire substrate, more particularly to the formation of a reflective film on the transparent dielectric substrate to enable the substrate to be recognized optically.

2. Description of the Related Art

Semiconductor integrated circuits formed in silicon films grown on sapphire substrates are advantageous for applications in environments in which radiation poses a hazard. Such silicon-on-sapphire (SOS) integrated circuits are generally formed by use of conventional fabrication equipment of the type that creates semiconductor integrated circuits in semiconductor substrates. In conventional fabrication processes, the fabrication equipment often uses optical sensors to detect the position of the semiconductor substrate. The position of a sapphire substrate cannot be detected in this way because sapphire is transparent: light passes straight through the substrate instead of being reflected back to the sensor. One known solution to this problem is to coat the sapphire substrate with a light-reflecting film.

Japanese Patent Application Publication No. 7-283383 and the parent U.S. Pat. No. 5,877,094, for example, describe a sapphire substrate coated on its backside with a layer of polycrystalline silicon (polysilicon) at least about two micrometers (2 µm) thick, which reflects light and can be detected optically. Phosphorous ions are also implanted into selected regions of the polysilicon film to form conductive doped regions that can be detected electrically.

One problem with this substrate is that forming a polysilicon layer at least about 2 µm thick is a time-consuming and therefore expensive process. Moreover, in reflow and other subsequent heating steps, the large difference in thermal expansion coefficients between sapphire and polysilicon may cause the sapphire substrate to warp. Such warping interferes with the fabrication process and may lead to the formation of cracks in the sapphire substrate, particularly if the sapphire substrate is thin, which is the current trend.

Japanese Patent Application Publication No. 11-220114 describes an SOS substrate having an optically reflecting polysilicon coating 0.5 µm to 3.0 µm thick on its backside. A pattern of cuts is formed in the reflective coating so that the difference in thermal expansion coefficients does not cause the substrate to warp or crack. The thickness of the polysilicon coating must be at least 0.5 µm because a thinner film would lack the necessary reflectivity, as pointed out in paragraph 0009 of the above disclosure.

Due to the trend toward thinner sapphire substrates, there is a continuing need for still thinner reflective films.

SUMMARY OF THE INVENTION

An object of the present invention is accordingly to provide a semiconductor device having a transparent dielectric substrate with a reflective coating film that can be thinner than 0.5 µm and still provide adequate reflectivity for optical detection.

The term 'semiconductor device' as used herein refers to an electronic device such as a semiconductor integrated circuit chip or to a wafer from which such electronic devices may be manufactured.

The invented semiconductor device has a dielectric substrate transparent to light, a first film disposed on the back surface of the dielectric substrate, a second film disposed on the first film, and a third film disposed on the second film. The first film and the second film have different reflective characteristics, enabling one film to reflect light not reflected by the other film.

The first, second, and third films combine to form a triple-layer light-reflecting film that has a higher reflectance than the conventional single-layer light-reflecting film and can be made thinner than the conventional single-layer light-reflecting film.

One method of fabricating the invented semiconductor device includes:

preparing a dielectric substrate that is transparent to light and has a front surface and a back surface;

forming a first film on the back surface of the dielectric substrate;

forming a second film on the first film;

heating the second film; and forming a third film on the heated second film.

Another method of fabricating the invented semiconductor device includes:

preparing a dielectric substrate that is transparent to light and has a front surface and a back surface;

forming a first film on the back surface of the dielectric substrate;

forming a second film on the first film by heating the first film; and forming a third film on the second film.

In one aspect of both methods, the second film has a lower refractive index than the first and third films.

In another aspect of both methods, the first, second, and third films have an aggregate thickness less than 0.5 µm.

In another aspect of both methods, the first film includes polysilicon, the second film includes silicon oxide, and the third film includes polysilicon.

In a further aspect of the preceding aspect, the first film is 42 nanometers thick, the second film is 110 nanometers thick, and the third film is 42 nanometers thick.

In another aspect of both methods, the dielectric substrate includes sapphire.

Another aspect of both methods also includes exposing the front surface of the dielectric substrate.

Another aspect of both methods also includes forming a fourth film on the front surface of the dielectric substrate.

The fourth film may include polysilicon.

Another aspect of both methods also includes forming a fifth film on the fourth film.

The fifth film may include silicon oxide.

In another aspect of both methods the dielectric substrate has side surfaces; this aspect also includes forming a sixth film covering the side surfaces of the dielectric substrate.

The sixth film may include polysilicon and silicon oxide.

When the second film includes silicon oxide ($SiO_2$), the above fabrication processes improve the crystalline structure of the silicon oxide. An attendant advantage is that in further fabrication steps involving etching by hydrofluoric acid, there are fewer crystal lattice defects through which the hydrofluoric acid can invade the silicon oxide film.

DETAILED DESCRIPTION OF THE INVENTION

Figure 1:
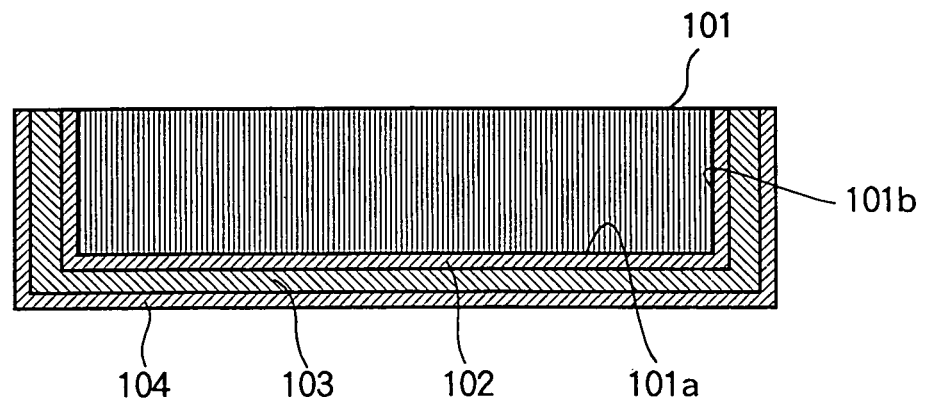
FIG. 1 is a sectional view of a semiconductor device according to the present invention.

Embodiments of the invention will now be described with reference to the attached drawings, in which like elements are indicated by like reference characters.

First Embodiment

Referring to FIG. 1, the first embodiment is a semiconductor device or wafer having a silicon-on-sapphire (SOS) substrate 101, the major surfaces of which are a front surface and a back surface 101a. The back surface 101a and side surfaces 101b of the SOS substrate 101 are covered with reflective films 102, 103, 104 to permit optical sensing by wafer sensing light. The second reflective film 103 has a lower refractive index than the first and third reflective films 102, 104. The first reflective film 102 is, for example, a polysilicon film formed on the back and side surfaces of the SOS substrate 101. The second reflective film 103 is, for example, a silicon oxide film formed on the first reflective film 102. The third reflective film 104 is, for example, a polysilicon film formed on the second reflective film 103.

Next the determination of the film thicknesses of the reflective films will be described.

Let the refractive index of the space through which the wafer sensing light travels before entering the SOS substrate 101 be $n_0$, the refractive index of the sensed material be $n_x$, and the refractive index of the space on the far side of the sensed material, through which the light travels if it passes through the sensed material, be $n_s$. In order for the sensed material to have high reflectance, its refractive index $n_x$ must be the higher than the space indices $n_0$ and $n_s$.

If the refractive index of the sensed material is higher than the space indices and the sensed material comprises a triple-layer film consisting of a first reflective film 102, second reflective film 103, and third reflective film 104, a reflectance close to unity can be achieved for the triple-layer film as a whole if the refractive index of the second reflective film 103 is lower than the refractive index of the first reflective film 102 and third reflective film 104.

Let the wavelength of the wafer sensing light be $\lambda$ and the refractive indices of the first reflective film 102, second reflective film 103, and third reflective film 104 be $n_1$, $n_2$ and $n_3$, respectively. If the wafer sensing light impinges normal (at a 90° angle) to the front surface of the SOS substrate 101, then to achieve still higher reflectance, the thickness d of each film, the wavelength $\lambda$ of the wafer sensing light, and the refractive index n of the film must satisfy the following equation (1) for some integer N:

$$(2N+1)\frac{\pi}{2} = 2\pi n \frac{d}{\lambda} \qquad (1)$$

A reflectance as close as possible to unity is achieved when the thicknesses and refractive indices $n_1$, $n_2$ and $n_3$ of all three films satisfy this equation (1) and the refractive indices also satisfy the relationship mentioned above ($n_2 < n_1$ and $n_2 < n_3$).

If the wavelength of the wafer sensing light is six hundred forty nanometers ($\lambda$=640 nm) and the first and third reflective films 102, 104 are polysilicon films, their refractive indices are both 3.80 ($n_1$=$n_3$=3.80). If the second reflective film 103 is a silicon oxide film, its refractive index at this wavelength is 1.45 ($n_2$=1.45). In order to achieve the minimum film thickness, N should be equal to zero (N=0). The thickness of the first and third reflective films 102, 104 can then be calculated from the above equation (1) as d=42.1 nm, while the film thickness of the second reflective film 103 can be calculated as d=109.8 nm. If the first and third reflective films 102, 104 are polysilicon films and the second reflective film 103 is a silicon nitride (SiN) film, then its refractive index is 2.02 ($n_2$=2.02), the film thickness of the first and third reflective films 102, 104 is still d=42.1, and the thickness of the second reflective film 103 is d=79.2 nm from equation (1) with N=0.

The reflectance of the wafer as a whole to the wafer sensing light can be calculated from the following equation (2), where as above, no is the refractive index of the space through which the wafer sensing light travels before entering the SOS substrate 101, $n_1$, $n_2$, and $n_3$, are the refractive indices of the first, second, and third reflective films 102, 103, 104, and $n_s$ is the refractive index of the space behind the third reflective film 104, assuming that the wafer sensing light impinges onto the front surface of the semiconductor substrate at a normal (90°) angle.

$$R = \left( \frac{n_0 n_s n_2^2 - n_1^2 n_3^2}{n_0 n_s n_2^2 + n_1^2 n_3^2} \right)^2 \qquad (2)$$

In the above example, as the dielectric substrate is transparent, its refractive index may be set equal to the refractive index ($n_0$) of the space through which the wafer sensing light travels before entering the SOS substrate 101. Equation (2) indicates that in order to achieve higher reflectance than that can be achieved by a single-layer light-reflecting film made from a high-index material, the first and third reflective films 102, 104 should be made from a material with a comparatively high refractive index, while the second reflective film 103 should be made from a material with a relatively low refractive index.

Figure 2:
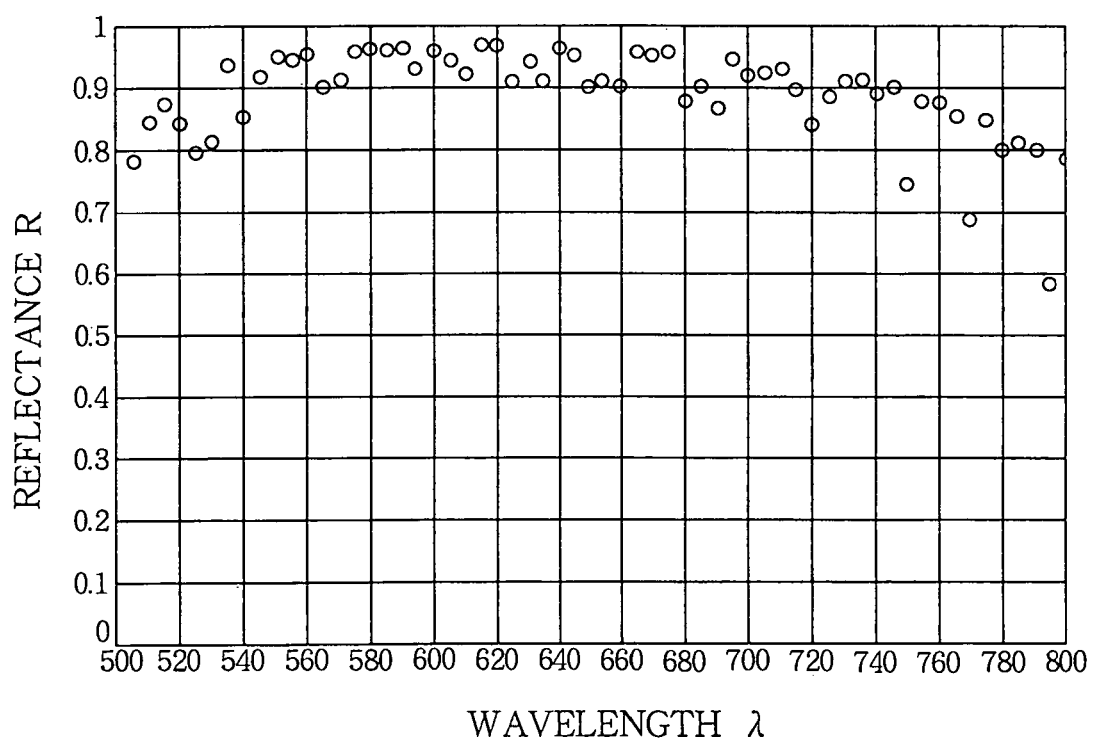
FIG. 2 is a graph indicating the reflectance of a wafer with a triple-layer reflective coating as a function of wavelength.

The refractive index n of each material varies according to the wavelength $\lambda$ of the wafer sensing light, so from equation (2), the reflectance R of the wafer as a whole also varies according to the wavelength. A plot of the reflectance R of the wafer as a whole versus the wavelength $\lambda$ of the wafer sensing light is shown in FIG. 2 for the case in which the first and third reflective films 102, 104 are polysilicon films, and the second reflective film 103 is a silicon oxide film.

If the wafer must have a reflectance R not less than 0.8 in order to be recognized by the wafer sensing light, the wavelength $\lambda$ of the sensing light should be about 640 nm ±100 nm. The corresponding thickness of the first and third reflective films 102, 104 can be calculated from equation (1) as d=42.1±6.6 nm (hereinafter referred to as about 42 nm). This can be taken as the allowable thickness range of the first and third reflective films 102, 104. The thickness of the second reflective film 103 can be calculated from equation (1) as d=109.8±17.2 nm (hereinafter referred to as about 110 nm). This can be taken as the allowable thickness range of the second reflective film 103.

Figure 3:
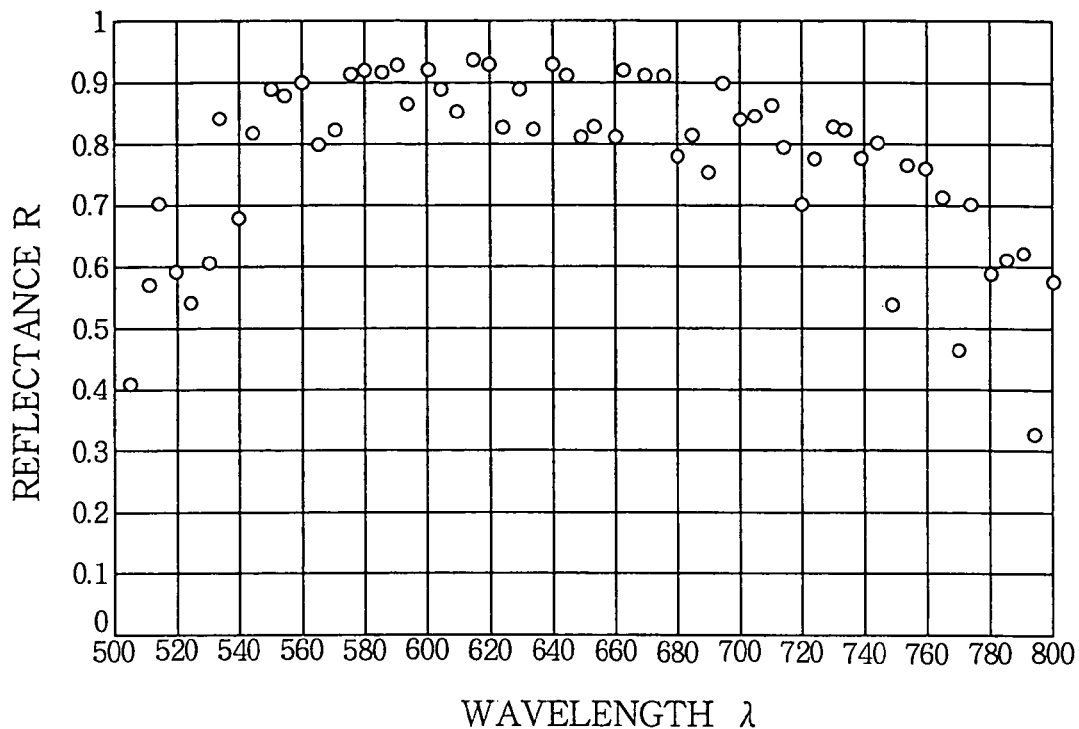
FIG. 3 is a graph indicating the reflectance of a wafer with another triple-layer reflective coating as a function of wavelength.

A plot of the reflectance R of the wafer as a whole versus the wavelength λ of the wafer sensing light is shown in FIG. 3 for the case in which the first and third reflective films 102, 104 are polysilicon films, and the second reflective film 103 is a silicon nitride film. If the requirement for recognition of the wafer is relaxed to a reflectance R not less than 0.7, the wavelength λ of the sensing light should again be about 640 nm±100 nm. The thickness of the first and third reflective films 102, 104 can again be calculated as d=42.1±6.6 nm (about 42 nm) from equation (1), the thickness of the second reflective film 103 can be calculated as d=79.2±12.4 nm (hereinafter referred to as about 80 nm), and these can be taken as the allowable thickness ranges of the respective films.

Next, the structure of the SOS substrate 101 will be described. The SOS substrate 101 is fabricated by depositing various films on a sapphire substrate. In this embodiment, the SOS substrate 101 may be of any one of the following three types.

Figure 4:
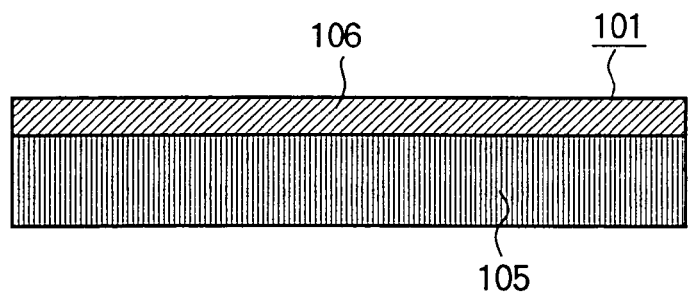
FIG. 4 is a more detailed sectional view showing an example of the structure of the substrate in FIG. 1.

The first type of SOS substrate 101, shown in FIG. 4, comprises a sapphire substrate 105 (dielectric substrate) and a device formation film 106 (a fourth film) formed on the sapphire substrate 105. The sapphire substrate 105 in FIG. 4 is six hundred micrometers (600 μm) thick; the device formation film 106 formed on the sapphire substrate 105 is 100 nm thick. The device formation film 106 can be made from silicon, which is the material from which transistors are typically made.

Figure 5:
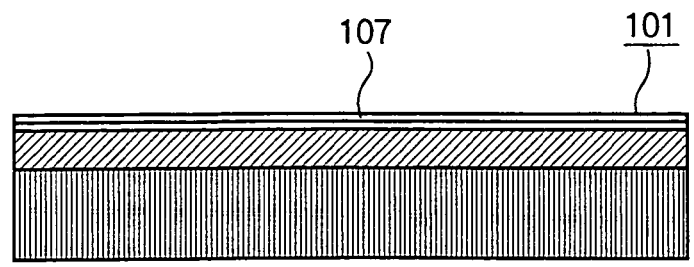
FIG. 5 is a more detailed sectional view showing another example of the structure of the substrate in FIG. 1.

The second type of SOS substrate 101, shown in FIG. 5, comprises a sapphire substrate 105, a device formation film 106 formed on the sapphire substrate 105, and a silicon oxide film 107 (a fifth film) formed on the device formation film 106. The sapphire substrate 105 in FIG. 5 is 600 μm thick, the device formation film 106 formed on the sapphire substrate 105 is 100 nm thick, and the silicon oxide film 107 formed on the device formation film 106 is 10 nm thick. The device formation film 106 may again be made of silicon. The SOS substrate 101 shown in FIG. 5 has the advantage that the silicon oxide film 107 protects the device formation film 106 during wafer processing steps performed prior to the formation of circuit elements, resulting in less variation in the electrical characteristics of the circuit elements.

Figure 6:
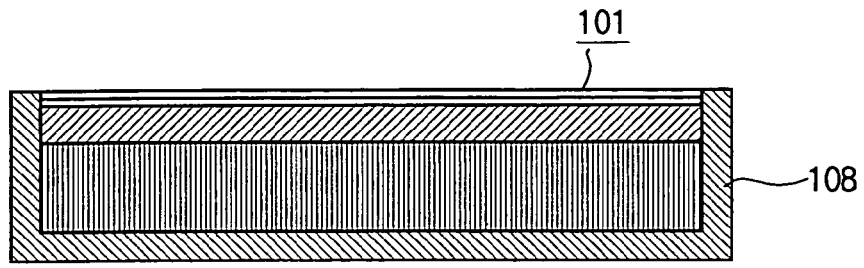
FIG. 6 is a more detailed sectional view showing yet another example of the structure of the substrate in FIG. 1.

The third type of SOS substrate 101, shown in FIG. 6 comprises the sapphire substrate 105, device formation film 106, and silicon oxide film 107 described above, and a protective film 108 (a sixth film) covering the side surfaces of the device formation film 106 and silicon oxide film 107 and the back surface of the sapphire substrate 105. The sapphire substrate 105 in FIG. 6 is 600 μm thick, the device formation film 106 is 100 nm thick, the silicon oxide film 107 is 10 nm thick, and the protective film 108 is 700 nm thick. The device formation film 106 may again be made of silicon. The protective film 108 may be made from a combination of a silicon nitride film and polysilicon. The SOS substrate 101 in FIG. 6 has the same advantages as the SOS substrate 101 in FIG. 5, and the additional advantage that the sides of the device formation film 106 can be protected from invasion by hydrofluoric acid, thus preventing flaking of the device formation film 106 and silicon oxide film 107. Furthermore, this structure can prevent unwanted diffusion during doping steps in the formation of circuit elements.

Any one of the three types of SOS substrate 101 described in FIGS. 4 to 6 can be used, according to the needs of the particular application.

Because of its triple-layer structure, the light-reflecting film of a semiconductor device according to the first embodiment of the invention can be thinner than a conventional single-layer light-reflecting film. Semiconductor chips can be fabricated by coating part or all of a wafer with a light-reflecting film according to the invention, forming circuit elements on the semiconductor substrate and interconnecting them by using conventional semiconductor fabrication equipment, and then dicing the wafer into individual chips. If the wafer sensors in the fabrication equipment illuminate only selected parts of the wafer, the triple-layer light-reflecting film only has to cover the selected parts. For example, the triple-layer light-reflecting film may cover only the peripheral parts of the wafer. Then after the wafer is divided into chips, none of the chips includes any portion of the light-reflecting film, so the thickness of the semiconductor chips can be further reduced.

Next, a process for fabricating a semiconductor device of the above type will be described with reference to FIGS. 7 to 11.

Figure 7:
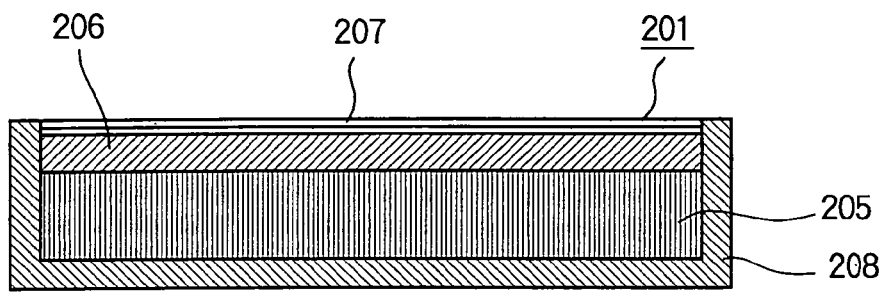
FIGS. 7 to 11 illustrate steps in a fabrication process for the semiconductor device in FIGS. 1 and 6.

Among the SOS substrates shown in FIGS. 4 to 6, a fabrication process using the SOS substrate shown in the FIG. 6 will be described. For numerological consistency, the component parts are numbered as shown in FIG. 7. The SOS substrate 201 in FIG. 7 comprises a transparent dielectric sapphire substrate 205, a device formation film 206 formed on the sapphire substrate 205 as a silicon film, a silicon oxide film 207 formed on the device formation film 206, and a protective film 208 formed on side surfaces of the sapphire substrate 205, the device formation film 206 and the silicon oxide film 207, and the back surface of the sapphire substrate 205.

Next, the fabrication process of the SOS substrate 201 will be summarized. First, a sapphire substrate 205 is obtained and a silicon film is formed thereon by chemical vapor deposition (CVD). Next, the part of the silicon film near the interface with the sapphire substrate 205 is transformed into amorphous silicon by an implantation process. Then the silicon close to the interface is crystallized by heating in an oxygen atmosphere to form the device formation film 206, and the silicon oxide film 207 is formed by oxidizing the remaining silicon film simultaneously. Next, the circumference is coated with a polysilicon CVD film; then the circumference is coated with a silicon nitride film. Next, the silicon oxide film 207 is exposed and the protective film 208 is formed to complete an SOS substrate 201 of the same type as shown in FIG. 6.

The SOS substrate 201 can have various structures other than the structure described above. For example, a substrate comprising the sapphire substrate 205 and the device formation film 206, or a substrate comprising the sapphire substrate 205, the device formation film 206 and the silicon oxide film 207 can be used. A silicon-on-insulator substrate comprising fused silica instead of sapphire is also usable instead of an SOS substrate, but the following description will continue to assume an SOS substrate.

Figure 8:
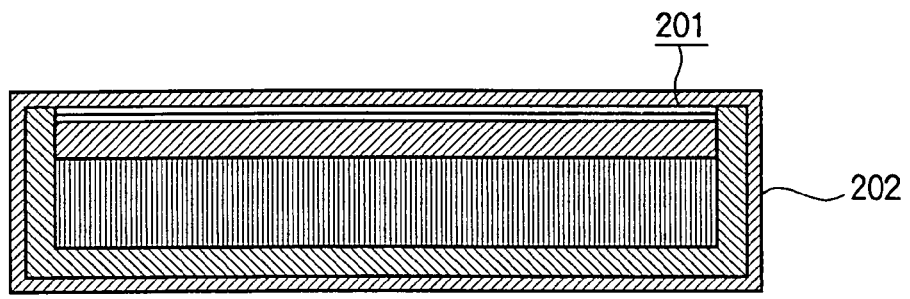

As shown in the FIG. 8, a first reflective film 202 is formed to cover all sides and surfaces of the SOS substrate 201. The first reflective film 202 is a film comprising polysilicon formed by CVD, and has a film thickness adjusted to 42 nm.

Figure 9:
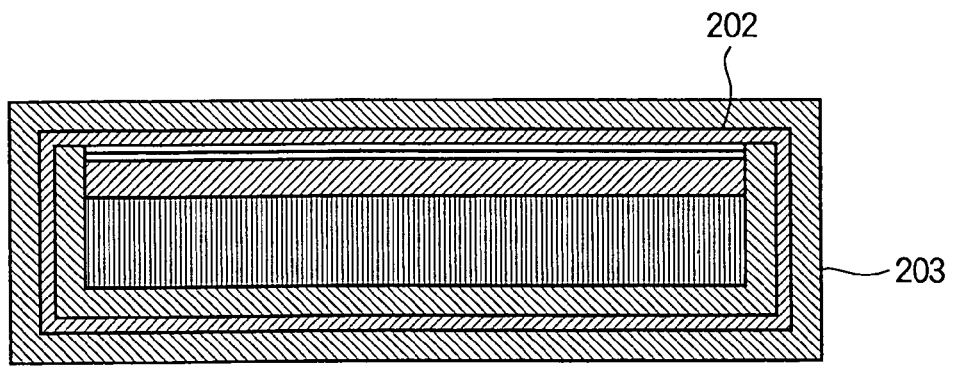

Referring to the FIG. 9, a second reflective film 203 is formed to cover the first reflective film 202. The second reflective film 203 is a silicon oxide film formed by CVD, and has a film thickness adjusted to 110 nm. Next, the second reflective film 203 is heated in a nitrogen ($N_2$) atmosphere at 950° Celsius for 20 minutes. The CVD process used to form the second reflective film 203 forms a silicon oxide film with poor crystallization, containing much vapor, which could be easily invaded by hydrofluoric acid during wet etching steps. The subsequent heating step, however, readily eliminates the vapor from the silicon oxide film, giving the silicon oxide film an improved crystalline structure that prevents invasion by hydrofluoric acid.

Figure 10:
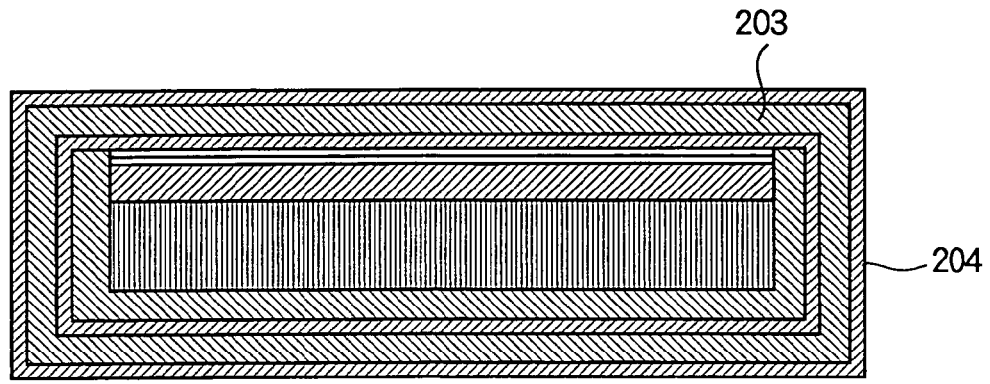

Referring to the FIG. 10, a third reflective film 204 is formed, covering the second reflective film 203. The third reflective film 204 is a polysilicon film formed by CVD, and having a film thickness adjustable to 42 nm by the time the light-reflecting film is needed for wafer detection. That is, if the thickness of the third reflective film 204 will be reduced by fabrication steps carried out after the formation of the three films 202, 203, 204, the third reflective film 204 may originally be made thicker than 42 nm in order to obtain the desired film thickness of 42 nm at the time of wafer detection.

Figure 11:
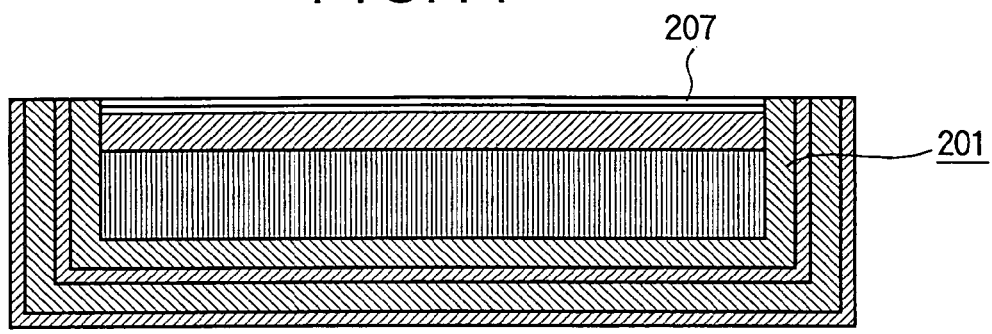

Referring to the FIG. 11, the silicon oxide film 207 of the SOS substrate 201 is exposed by removing the first, second, and third light-reflecting films 202, 203, 204 from the front surface of the substrate. The first, second, and third light-reflecting films may be removed by dry etching.

The above process fabricates a semiconductor wafer device according to the second embodiment of the invention. After the triple-layer light-reflecting film has been formed, semiconductor integrated circuit devices can be fabricated by using conventional semiconductor IC fabrication equipment with optical wafer sensors to form any desired circuitry in and on the device formation film 206, and then dicing the wafer into chips.

In a variation of the second embodiment, the triple-layer light-reflecting film does not cover the entire back surface of the wafer. In particular, if the optical wafer sensors illuminate only selected parts of the wafer, the triple-layer film can be removed from the other parts of the wafer to reduce the thickness of the chips.

In the fabrication process of the second embodiment, the heating step improves the crystalline structure of the second light-reflecting film. Furthermore, the problem of unintended detachment of the third light-reflecting film can be avoided. This problem occurs when a triple-layer light-reflecting film is formed by sequentially depositing a first light-reflecting film, a second light-reflecting film, and a third light-reflecting film made from polysilicon, silicon oxide and polysilicon, respectively, on the back surface of a dielectric substrate by CVD. In this method, in subsequent steps using hydrofluoric acid, the acid reacts with the silicon oxide film material of the second light-reflecting film, thereby invading the silicon oxide film. If the invasion proceeds far enough, eventually the third light-reflecting film becomes detached. By avoiding this problem, the second embodiment maintains the desired optical properties of the light-reflecting film and prevents detached fragments of film from contaminating the fabrication equipment.

Next, a semiconductor device fabrication process according to a third embodiment of the invention will be described with reference to FIGS. 12 to 16. Steps similar to steps in the second embodiment will not be described in detail.

Figure 12:
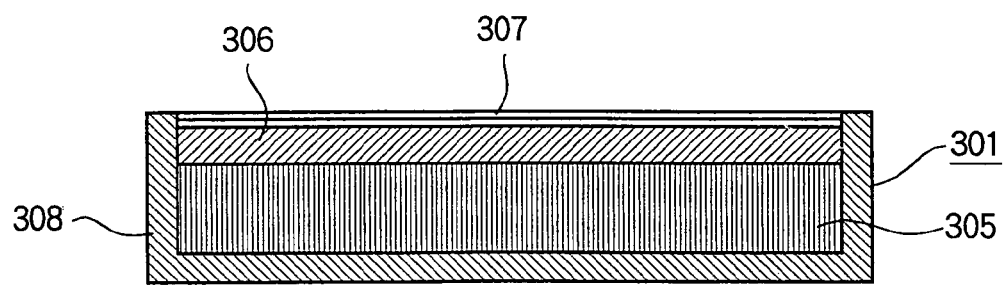
FIGS. 12 to 16 illustrate steps in another fabrication process for the semiconductor device in FIGS. 1 and 6.

Referring to FIG. 12, an SOS substrate 301 comprising a sapphire substrate 305, a device formation film 306, a silicon oxide film 307, and a protective film 308 is obtained. A detailed description of this step will be omitted, as the SOS substrate 301 is similar in structure and fabrication to the SOS substrate described in the second embodiment, or any of the SOS substrates described in the first embodiment.

Figure 13:
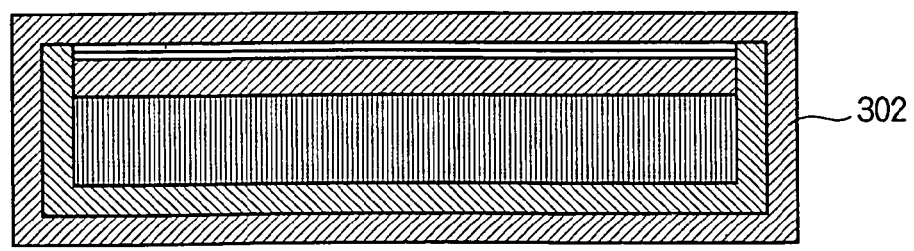

Referring to FIG. 13, a first reflective film 302 is formed to cover all sides and surfaces of the SOS substrate 301. The first reflective film 302 is a polysilicon film formed by CVD. Part of the first reflective film 302 will become a silicon oxide film as described below. To allow for a doubling of the thickness of this part when the polysilicon is oxidized, the thickness of the first reflective film 302 is reduced to 100 nm.

Figure 14:
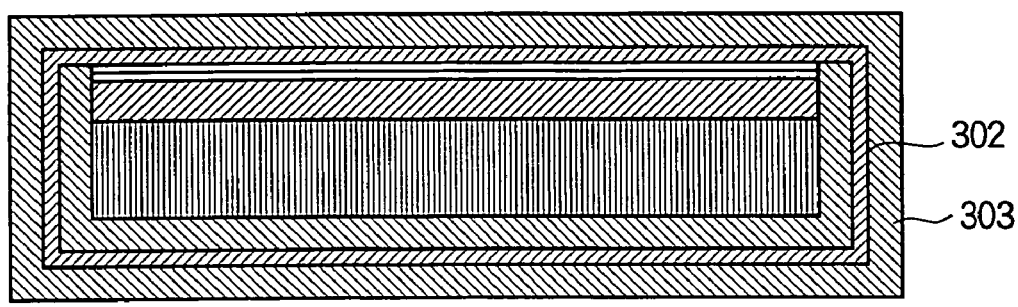

Referring to FIG. 14, a second reflective film 303 is formed covering the first reflective film 302. The second reflective film 303 is formed by heating the first reflective film 302 at 950° Celsius in an oxygen atmosphere for an appropriate length of time to oxidize substantially the outer 58 nm of the first reflective film 302. The oxidization process approximately doubles the thickness of the oxidized material, creating a second reflective film 303 substantially 110 nm thick. A second reflective film 303 formed in this way has a better crystal lattice structure than a silicon oxide film formed by CVD, and can better prevent invasion of hydrofluoric acid in subsequent wet etching steps. The remaining part of the first reflective film 302 is substantially 42 nm thick.

Figure 15:
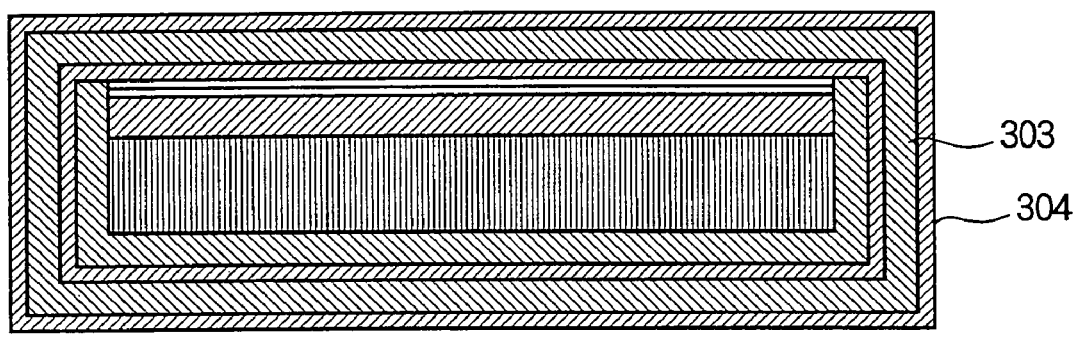

Referring to FIG. 15, a third reflective film 304 is formed covering the second reflective film 303. This step will not be described in detail because it is similar to the corresponding step described in the second embodiment.

Figure 16:
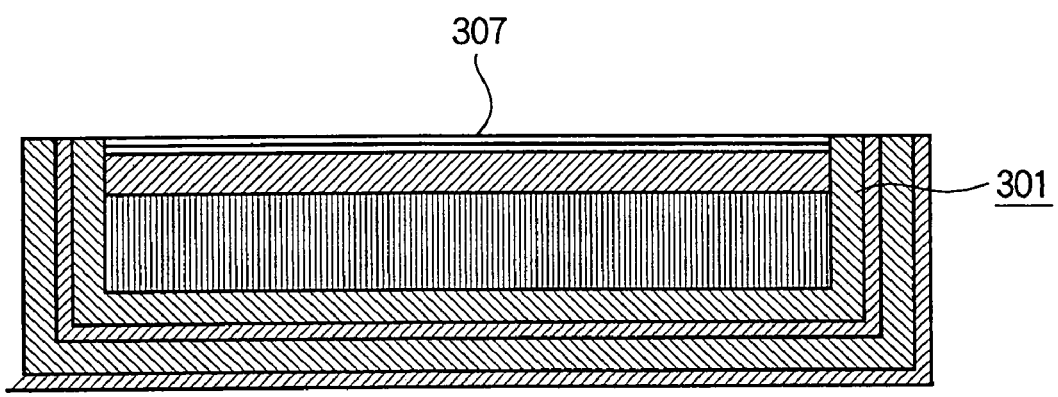

Referring to FIG. 16, the silicon oxide film 307 of the SOS substrate 301 is exposed. This step is also similar to the corresponding step in the second embodiment, and will not be described in detail.

This completes the fabrication of a semiconductor wafer device according to the third embodiment of the invention. As in the second embodiment, semiconductor integrated circuit devices can be fabricated by forming desired circuitry in and on the device formation film of the SOS substrate, using conventional semiconductor fabrication equipment with optical wafer sensors, and then dicing the wafer into individual chips. As noted in the second embodiment, before the circuitry is formed, the triple-layer light-reflecting film can be removed from parts of the wafer not illuminated by light from the optical wafer sensors, to reduce the thickness of the chips.

The third embodiment has effects similar to those of the second embodiment, and the additional advantage of reduced cost, compared to the second embodiment, because the second light-reflecting film is formed by heating in an oxygen atmosphere, so one CVD step can be omitted from the process described in the second embodiment.

The invention is not limited to a silicon-on-sapphire substrate. It is applicable to a semiconductor device with any type of transparent dielectric substrate, and may include any type of semiconductor material.

Those skilled in the art will recognize that further variations are possible within the scope of the invention, which is defined in the appended claims.

What is claimed is:

1. A semiconductor device having a dielectric substrate transparent to light, the dielectric substrate having a pair of major surfaces, one of the major surfaces being a front surface having a device formation film thereon, and another of the major surfaces being a back surface, the semiconductor device comprising:

a first film of a first material that reflects sensing light illuminated thereon from an external source, the first film disposed on the back surface of the dielectric substrate;

a second film of a second material that reflects the sensing light, disposed on the first film, the second material differing from the first material; and a third film of a third material that reflects the sensing light, disposed on the second film, wherein the second film has a lower refractive index than the first and third films, wherein the first film comprises polysilicon, the second film comprises silicon oxide, and the third film comprises polysilicon, and wherein the first film has a thickness of substantially 42 nm, the second film has a thickness of substantially 110 nm, and the third film has a thickness of substantially 42 nm.

2. The semiconductor device of 1, wherein the dielectric substrate includes sapphire, the semiconductor device further comprising:

a fourth film disposed on the front surface of the dielectric substrate, the fourth film including silicon; and a fifth film disposed on the fourth film, the fifth film including silicon oxide.

3. The semiconductor device of 1, wherein the dielectric substrate comprises a sapphire substrate.

4. The semiconductor device of claim 1, further comprising a fourth film disposed on the front surface of the dielectric substrate.

5. The semiconductor device of 4, wherein the fourth film comprises silicon.

6. The semiconductor device of 4, further comprising a fifth film disposed on the fourth film.

7. The semiconductor device of 6, wherein the fourth film comprises silicon and the fifth film comprises silicon oxide.

8. The semiconductor device of claim 1, wherein the dielectric substrate has side surfaces and a sixth film covering at least the side surfaces.

9. The semiconductor device of claim 8, wherein the sixth film comprises polysilicon and silicon nitride.

10. The semiconductor device of claim 8, wherein the sixth film also covers the back surface of the dielectric substrate, being disposed between said back surface and the first film.

11. The semiconductor device of claim 1, the semiconductor device being disposed as part of a wafer, wherein the first film, the second film, and the third film reflect the sensing light to provide indication of the wafer.

12. A semiconductor device having a dielectric substrate transparent to light, the dielectric substrate having a pair of major surfaces, one of the major surfaces being a front surface having a device formation film thereon, and another of the major surfaces being a back surface, the semiconductor device comprising:

a first film of a first material that reflects sensing light illuminated thereon from an external source, the first film disposed on the back surface of the dielectric substrate;

a second film of a second material that reflects the sensing light, disposed on the first film, the second material differing from the first material; and a third film of a third material that reflects the sensing light, disposed on the second film, wherein the second film has a lower refractive index than the first and third films, wherein the first film comprises polysilicon, the second film comprises silicon nitride, and the third film comprises polysilicon, and wherein the first film has a thickness of substantially 42 nm, the second film has a thickness of substantially 80 nm, and the third film has a thickness of substantially 42 nm.

* * * * *